(12) United States Patent
Watts

(10) Patent No.: US 7,276,316 B2
(45) Date of Patent: Oct. 2, 2007

(54) COMMON SECOND LEVEL FRAME EXPOSURE METHODS FOR MAKING EMBEDDED ATTENUATED PHASE SHIFT MASKS

(75) Inventor: Andrew J. Watts, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 10/708,010

(22) Filed: Feb. 2, 2004

(65) Prior Publication Data

US 2005/0170261 A1    Aug. 4, 2005

(51) Int. Cl.
G03F 1/00    (2006.01)
G03F 1/14    (2006.01)

(52) U.S. Cl. .......................................... 430/5
(58) Field of Classification Search ................. 430/5
See application file for complete search history.

(56) References Cited

U.S. PATENT DOCUMENTS

| | | | |
|---|---|---|---|
| 4,343,877 A * | 8/1982 | Chiang | 430/5 |
| 4,797,334 A * | 1/1989 | Glendinning | 430/5 |
| 5,405,734 A * | 4/1995 | Aita | 430/323 |
| 5,679,483 A * | 10/1997 | Maurer | 430/5 |
| 5,741,613 A * | 4/1998 | Moon et al. | 430/5 |
| 6,194,103 B1 | 2/2001 | Tzu et al. | |
| 6,277,527 B1 | 8/2001 | O'Grady et al. | |
| 6,306,549 B1 | 10/2001 | Baracchi | |
| 6,415,431 B1 | 7/2002 | Neary | |
| 6,423,455 B1 * | 7/2002 | Tzu | 430/5 |
| 6,472,766 B2 | 10/2002 | Xiao | |
| 6,524,755 B2 | 2/2003 | Jin et al. | |
| 6,529,463 B1 | 3/2003 | Goodberlet | |
| 6,544,696 B2 | 4/2003 | Westerman et al. | |
| 6,549,277 B1 * | 4/2003 | Narushima et al. | 356/218 |
| 6,710,847 B1 * | 3/2004 | Irie | 355/53 |
| 2001/0036581 A1 * | 11/2001 | Inao et al. | 430/5 |

* cited by examiner

Primary Examiner—Mark F. Huff
Assistant Examiner—John Ruggles
(74) Attorney, Agent, or Firm—DeLio & Peterson, LLC; Peter W. Peterson; Richard M. Kotulak

(57) ABSTRACT

A method of making an embedded attenuated phase shift mask (EAPSM) comprises initially providing a phase shift mask substrate having a layer of phase shifting material and a layer of an opaque material, and depositing a first resist layer on the substrate. The first resist layer is exposed by a direct write electron beam or laser energy source and developed, and the substrate is etched, to create first level phase shifting image segments on the substrate corresponding to areas of critical structures to be exposed with the EAPSM. The method then includes depositing a second resist layer on the substrate. Using a single frame exposure mask corresponding to non-critical areas outside the critical structure areas, the second resist layer is then exposed by simultaneous projection exposure. The method then includes developing the second resist layer and etching the substrate to remove the opaque material from the critical structure areas.

17 Claims, 4 Drawing Sheets

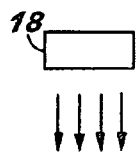
FIG. 1
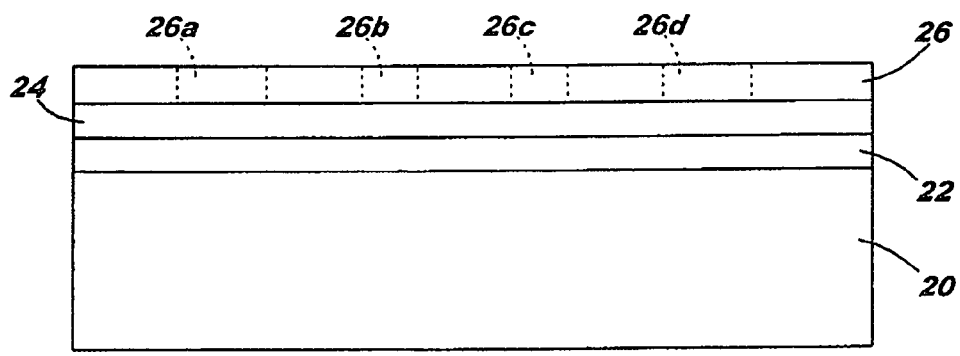
FIG. 2
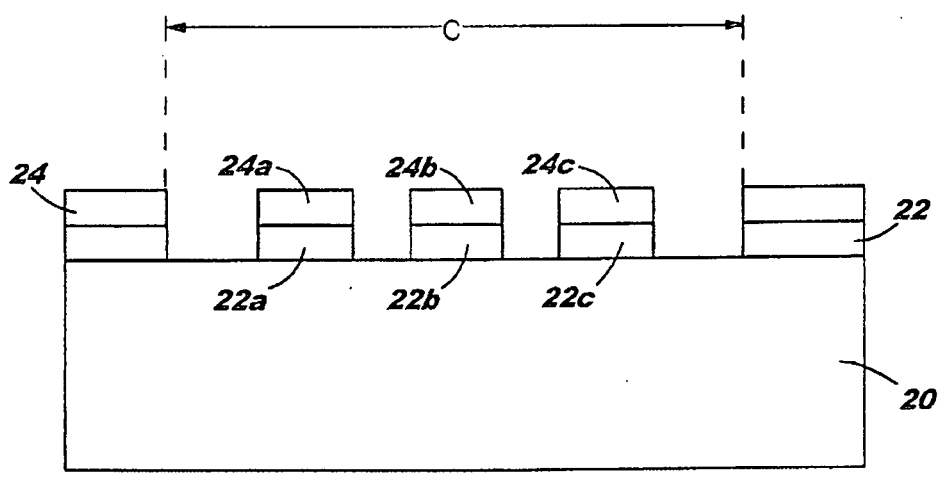

COMMON SECOND LEVEL FRAME EXPOSURE METHODS FOR MAKING EMBEDDED ATTENUATED PHASE SHIFT MASKS

BACKGROUND OF INVENTION

1. Field of the Invention

The present invention is directed to the manufacture of masks used in the lithographic production of integrated circuits and, in particular, to the manufacture of embedded attenuated phase shifting masks (EAPSMs).

2. Description of Related Art

As an alternative to chromium on glass (COG) masks used in the lithographic production of integrated circuits, phase shifting masks (PSMs) have been employed in order to increase the resolution of the critical active area patterns projected. Such increased resolution enables smaller line widths to be exposed on the resist and consequently etched into or deposited on the wafer substrate. Some PSMs have used chromium as an opaque layer in conjunction with phase shifting image segments on the mask substrate, which correspond to areas of critical structures to be exposed with the PSMs.

Other PSMs for example, embedded attenuated phase shift masks (EAPSMs), utilize opaque layers of chromium to mask non-critical areas outside of the critical structure areas. As used herein, the term critical structures includes lines, contacts and other active regions to be exposed in a resist layer, subsequently developed, etched and/or deposited on the wafer to form an integrated circuit device or portion thereof. These phase shifting image segments typically impart a 180° phase shift of the polarization of the energy beam, e.g., visible or ultraviolet light. In manufacturing an EAPSM, a first exposure is typically made to create the phase shifting and opaque image segments on the substrate corresponding to areas of the critical structures, and a second exposure is made to selectively remove the opaque material in the area of critical structures but to leave the opaque material in the area surrounding the area of critical structures.

Typically, EAPSMs have been produced with costly laser or electron beam writing tools. While a typical COG mask may take 24 hours to fabricate, because of the requirement of utilizing two exposures, EAPSMs can take significantly longer to fabricate, up to 42 hours or more. This extended manufacturing time also ties up the use of the laser or electron beam writing tools. Additional costs are incurred in utilizing the laser and electron beam writing tools where the EAPSM is damaged or redesigned, or otherwise reworked, and must therefore be remanufactured. As a result EAPSMs while being extremely effective are also significantly more expensive to manufacture.

SUMMARY OF INVENTION

Bearing in mind the problems and deficiencies of the prior art, it is therefore an object of the present invention to provide a method of manufacturing embedded attenuated phase shifting masks (EAPSMs) in a less time consuming and less costly manner.

It is another object of the present invention to provide a method of manufacturing EAPSMs which reduces the time for employing laser or electron beam tools.

A further object of the invention is to provide a method of manufacturing EAPSMs which simplifies the second level exposure to remove unwanted chrome image segments from the mask.

It is yet another object of the present invention to provide an improved method of remanufacturing reworked, damaged and/or redesigned EAPSMs.

The above and other objects, which will be apparent to those skilled in the art, are provided in the present invention which is directed to a method of making an embedded attenuated phase shift mask (EAPSM) comprising initially providing a phase shift mask substrate having a layer of phase shifting material and a layer of an opaque material, and depositing a first resist layer on the substrate. The first resist layer is exposed and developed, and the substrate is etched, to create first level phase shifting image segments on the substrate corresponding to areas of critical structures to be exposed with the EAPSM. The method then includes depositing a second resist layer on the substrate. There is then provided a single frame exposure mask corresponding to non-critical areas outside the critical structure areas. Using the single frame exposure mask, the second resist layer is then exposed. The method then includes developing the second resist layer and etching the substrate to remove the opaque material from the critical structure areas.

Preferably, a direct write electron beam or laser energy source is used to expose the first resist layer, and the second resist layer is exposed by an energy source other than the energy source used to expose the first resist layer. More preferably, the second resist layer is exposed by simultaneous projection exposure.

The method may further include identifying and storing the single frame exposure mask for future use with the EAPSM. Where the EAPSM needs to be reworked, is damaged or is redesigned, the method may further include using the single frame exposure mask to repair or remanufacture the EAPSM.

The method may include identifying and storing the single frame exposure mask for future use with other EAPSMs in the same mask set as the EAPSM, or with other EAPSMs having the same chip or field size as the EAPSM.

The single frame exposure mask may use a 1:1 reduction ratio to expose the second resist layer, or a reduction ratio other than 1:1.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is a cross-sectional elevational view of the commencement of the process of creating the first level exposure of phase shifting image segments, corresponding to areas of critical structures to be exposed, on an EAPSM.

FIG. 2 is a cross-sectional elevational view of the completed first level exposure, developing and etching of the EAPSM of FIG. 1.

DETAILED DESCRIPTION

Figure 3:
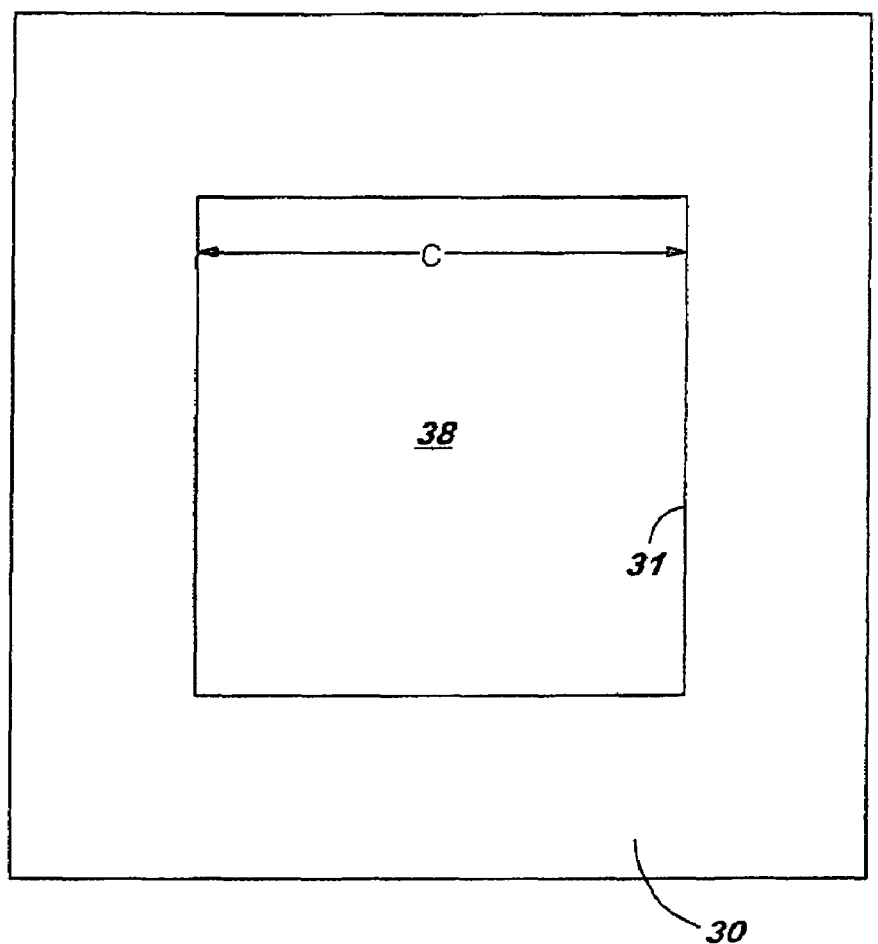
FIG. 3 is a top plan view of the single frame exposure mask used in connection with the present invention.

In describing the preferred embodiment of the present invention, reference will be made herein to FIGS. 1-6 of the drawings in which like numerals refer to like features of the invention. Features of the invention are not necessarily shown to scale in the drawings.

FIG. 1 depicts the commencement of the process of fabricating the EAPSM in accordance with the present invention, wherein a mask substrate has a base 20 which is transparent to the energy source to be used in the lithographic production of the integrated circuit device, and which is overlaid with a layer 22 of a phase shifting material and then overlaid with a material layer 24 which is opaque to the lithographic energy source. Typically, the transparent substrate base 20 is quartz. The phase shifting material may be any conventionally used in the art such as $MoSi_x$, $MoSi_xO_yN_z$, $Si_xN_y$ or $CrO_xF_y$. In addition to these phase shifting materials, the quartz substrate itself may be made to induce a phase shift by etching the image segments to different levels, i.e., thicknesses, beneath the surface of substrate base 20 such that desired phase shift is imparted to the energy beam.

Opaque layer 24 may be made of any suitable material such as chromium. Deposited over the phase shifting and opaque layers is a resist layer 26. This resist may be a positive resist, in which a region to be printed is exposed to the energy source, or a negative resist in which the region to be printed is not exposed to the energy source. In the resist layer 26 depicted in FIG. 1, regions 26a, 26b, 26c and 26d are to be developed and removed from resist layer 26 in order to etch the underlying opaque layer 24 and phase shifting material layer 22. These image containing areas 26a, 26b, 26c and 26d are created by a modulated electron beam or laser writing tool 18 which directly writes the image into the resist layer without the use of a mask.

Following the first level exposure of resist layer 26, the resist layer is developed and areas of 26a-26d are removed. Thereafter, a suitable etchant is utilized to etch corresponding openings in opaque layer 24 and phase shifting material layer 22. After removal of the remaining resist layer 26, the resulting structure is depicted in FIG. 2, wherein phase shifting segments 22a, 22b, and 22c have overlying opaque segments 24a, 24b, 24c, respectively. These phase shifting segments 22a, 22b and 22c are used for forming images in the areas of critical structures to be exposed using the EAPSM. This critical structure area is shown having a width dimension C. Portions of the opaque layer 24 also remain outside of this critical area.

In accordance with the present invention, a single frame exposure mask 30 is utilized, as depicted in FIG. 3. The single frame exposure mask 30 is manufactured to have an opening 38 of dimension C, bounded by mask edge 31, corresponding to the dimension of the critical area C to be exposed with the EAPSM. As shown, the mask 30 has a 1:1 reduction ratio, i.e. is the same size as the critical area C on the EAPSM. Mask opening 38 may have other sizes to correspond to other reduction ratios, either greater than or less than the 1:1 reduction illustrated.

Figure 4:
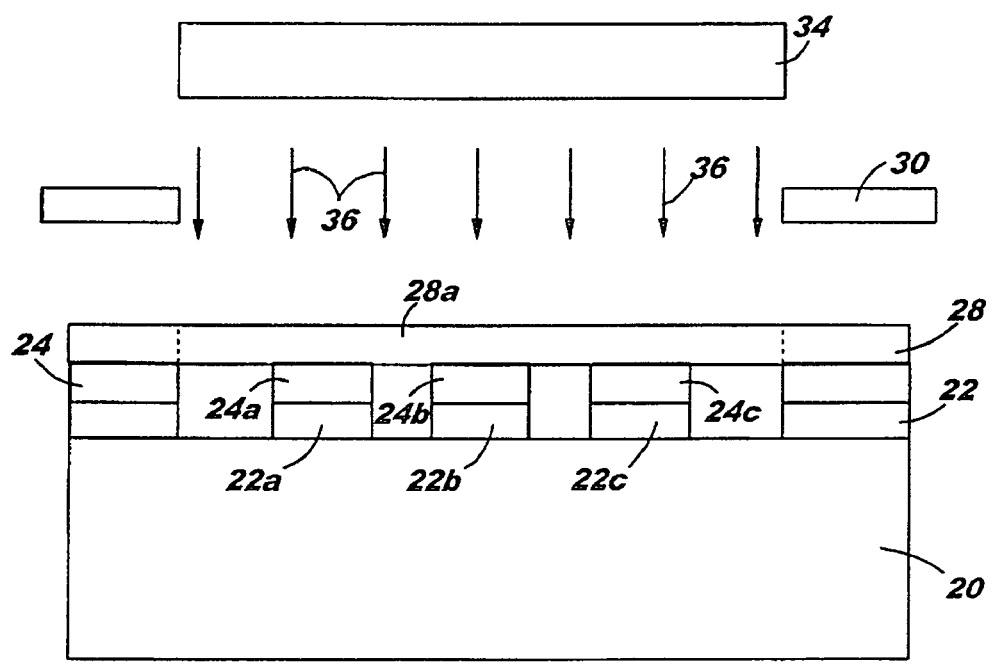
FIG. 4 is a cross-sectional elevational view of the commencement of the process of creating the second level exposure to remove opaque material from the critical structure areas of the EAPSM of FIG. 1, using the single frame exposure mask of FIG. 3.

In fabricating the EAPSM mask in accordance with the present invention, a second resist layer 28 is applied over the etched opaque and phase shifting image segments created by the first exposure on EAPSM substrate base 20, and mask 30 is secured thereover (FIG. 4). Energy source 34, utilizing visible light, UV or other energy beams 36, simultaneously exposes resist layer portion 28a corresponding to the critical area of the mask. After exposure, the second resist layer 28 is developed and exposed area 28 is removed, to arrive at the structure shown in FIG. 5. While resist layer portions 28b and 28c remain over the areas outside of the critical structure area, all resist is removed from within these portions. The remaining opaque layer regions 24a, 24b and 25c within the critical area are then etched away, and the remaining second level resist is removed, which results in the structure shown in FIG. 6. In the finished EAPSM mask depicted, the unwanted opaque layer 24 segments have been removed from within the critical area C, leaving only the chromium layer segments 24d, 24e in the non-critical areas outside of the critical area. The remaining phase shifting image segments 22a, 22b and 22c may now be used in connection with transparent substrate base 20 to impart the desired phase shifting pattern, using a photolithographic process, in the active area of integrated circuit device wafer substrate.

Figure 5:
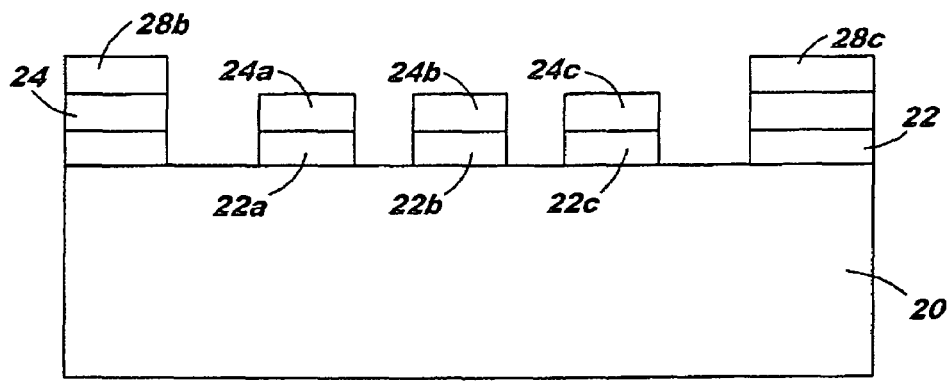
FIG. 5 is a cross-sectional elevational view during the process of creating the second level exposure of the EAPSM of FIG. 1, after the resist layer has been developed and partially removed.
Figure 6:
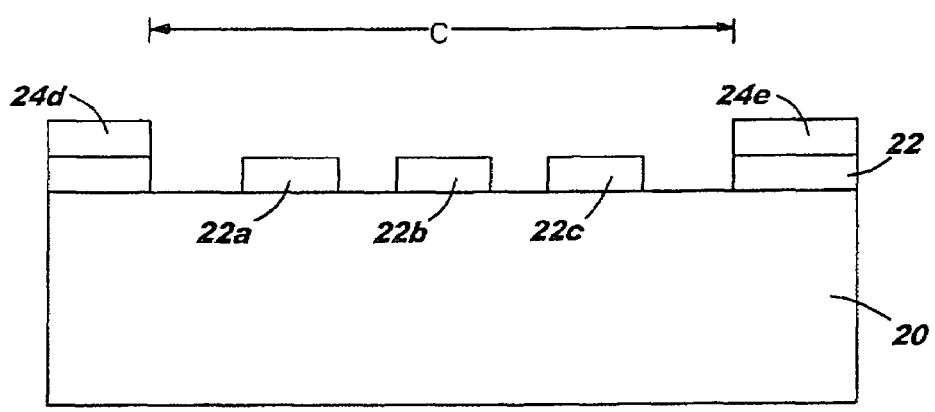
FIG. 6 is a cross-sectional elevational view of the completed EAPSM of FIG. 1.

Energy source 34 (FIG. 4) is preferably a source other than the electron beam or laser writing energy source utilized to create the first level exposure, so that in the second level exposure level depicted in FIGS. 4-6, a less costly optical projection system may be utilized.

Following the manufacture of the EAPSM depicted in FIG. 6, mask 30 may be marked with an identification and stored in a library of such masks for future use. The identification may be marked with the particular EAPSM mask in a given mask set, or with identification of the same chip and/or field (critical area) size. In the event that a particular EAPSM mask, or one similar to it, needs to be reworked, or is damaged or redesigned, the single frame exposure mask 30 identified with that particular type of EAPSM may be obtained from the mask library for use in remanufacturing the second level exposure. In view of the use of multiple EAPSM mask layers depending on the design rules, such as where 130 mm nodes may use 2-7 EAPSM masks and 90 mm nodes may use 8-9 EAPSM masks, the present invention presents a substantial improvement since only one single frame exposure can be used.

Thus, the present invention provides for the manufacturing of EAPSMs in a less time consuming and less costly manner which simplifies the second level exposure to remove unwanted chrome image segments from the mask by reducing the time for employing laser or electron beam tools.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method of making an embedded attenuated phase shift mask (EAPSM) comprising:
   providing a phase shift mask substrate having a layer of phase shifting material and a layer of an opaque material;

depositing a first resist layer on the substrate;

exposing and developing the first resist layer and etching the substrate to create first level phase shifting image segments on the substrate corresponding to areas of critical structures to be exposed with the EAPSM;

depositing a second resist layer on the substrate having first level phase shifting image segments;

providing a single frame exposure mask corresponding to non-critical areas outside the critical structure areas;

using the single frame exposure mask, exposing the second resist layer;

developing the second resist layer;

etching the critical structure areas to remove the opaque material therefrom;

marking the single frame exposure mask with an identification corresponding to the EAPSM or corresponding to chip or field size of the EAPSM;

storing the single frame exposure mask in a mask library for future use;

obtaining the single frame exposure mask from the mask library; and using the single frame exposure mask to repair or remanufacture the EAPSM.

2. The method of claim 1 wherein exposing the first resist layer is by use of a direct write electron beam or laser energy source, and wherein exposing the second resist layer is by an energy source other than the energy source used to expose the first resist layer.

3. The method of claim 1 wherein exposing the second resist layer is by simultaneous projection exposure.

4. The method of claim 1, wherein the EAPSM is reworked, and further including using the single frame exposure mask to remanufacture the EAPSM.

5. The method of claim 1, wherein the EAPSM is damaged, and further including using the single frame exposure mask to repair the EAPSM.

6. The method of claim 1, wherein the EAPSM is redesigned, and further including using the single frame exposure mask to remanufacture the EAPSM.

7. The method of claim 1 further including identifying and storing the single frame exposure mask for future use with other EAPSMs in a same mask set as the EAPSM.

8. The method of claim 3 further including identifying and storing the single frame exposure mask for future use with other EAPSMs having the same chip or field size as the EAPSM.

9. The method of claim 1 wherein the single frame exposure mask uses a 1:1 reduction ratio to expose the second resist layer.

10. The method of claim 1 wherein the single frame exposure mask uses a reduction ratio other than 1:1 to expose the second resist layer.

11. A method of making an embedded attenuated phase shift mask (EAPSM) comprising:

providing a phase shift mask substrate having a layer of phase shifting material and a layer of an opaque material;

depositing a first resist layer on the substrate;

exposing the first resist layer with a direct write electron beam or laser energy source;

developing the first resist layer and etching the substrate to create first level phase shifting image segments on the substrate corresponding to areas of critical structures to be exposed with the EAPSM;

depositing a second resist layer on the substrate having first level phase shifting segments;

providing a single frame exposure mask corresponding to non-critical areas outside the critical structure areas;

using the single frame exposure mask, exposing the second resist layer by simultaneous projection exposure;

developing the second resist layer;

etching the critical structure areas to remove the opaque material therefrom;

marking the single frame exposure mask with an identification corresponding to the EAPSM or corresponding to chip or field size of the EAPSM;

storing the single frame exposure mask in a mask library for future use with other EAPSMs in the same mask set as the EAPSM, or with other EAPSMs having the same chip or field size as the EAPSM;

obtaining the single frame exposure mask from the mask library; and using the single frame exposure mask to repair or remanufacture the EAPSM.

12. The method of claim 11, wherein the EAPSM is reworked, is damaged or is redesigned, and further including using the single frame exposure mask to repair or remanufacture the EAPSM.

13. The method of claim 11 wherein the single frame exposure mask uses a 1:1 reduction ratio to expose the second resist layer.

14. The method of claim 11 wherein the single frame exposure mask uses a reduction ratio other than 1:1 to expose the second resist layer.

15. A method of making an embedded attenuated phase shift mask (EAPSM) comprising:

providing a phase shift mask substrate having a layer of phase shifting material and a layer of an opaque material;

depositing a first resist layer on the substrate;

exposing the first resist layer with a direct write electron beam or laser energy source;

developing the first resist layer and etching the substrate to create first level phase shifting image segments on the substrate corresponding to areas of critical structures to be exposed with the EAPSM;

depositing a second resist layer on the substrate having first level phase shifting image segments;

providing a single frame exposure mask corresponding to non-critical areas outside the critical structure areas;

using the single frame exposure mask, exposing the second resist layer by an energy source other than the energy source used to expose the first resist layer;

developing the second resist layer;

etching the critical structure areas to remove the opaque material therefrom; and identifying and storing the single frame exposure mask for future use with the EAPSM in the same mask set as the EAPSM, or with other EAPSMs having the same chip or field size as the EAPSM.

16. The method of claim 15, wherein the EAPSM is reworked, is damaged or is redesigned, and further including using the single frame exposure mask to repair or remanufacture the EAPSM.

17. The method of claim 15 wherein exposing the second resist layer is by simultaneous projection exposure.

* * * * *